United States Patent
Ma et al.

(10) Patent No.: US 8,688,177 B2
(45) Date of Patent: Apr. 1, 2014

(54) DOUBLE-FOLDED FLEXIBLE PRINTED CIRCUIT BOARD FOR SLIDER-TYPE MOBILE DEVICES

(75) Inventors: Yawei Ma, San Diego, CA (US); Ichiro Yamada, Del Mar, CA (US); Chandrashekar Subba, Redwood City, CA (US)

(73) Assignees: Sony Corporation, Tokyo (JP); Sony Mobile Communications AB, Lund (SE)

( * ) Notice: Subject to any disclaimer, the term of this patent is extended or adjusted under 35 U.S.C. 154(b) by 120 days.

(21) Appl. No.: 13/391,663

(22) PCT Filed: Jul. 23, 2010

(86) PCT No.: PCT/US2010/042984
§ 371 (c)(1),
(2), (4) Date: Feb. 22, 2012

(87) PCT Pub. No.: WO2012/011916
PCT Pub. Date: Jan. 26, 2012

(65) Prior Publication Data
US 2012/0157171 A1    Jun. 21, 2012

(51) Int. Cl.
*H04M 1/00* (2006.01)

(52) U.S. Cl.
USPC ............... 455/575.1; 455/550.1; 455/556.2; 455/575.3; 455/575.4; 455/575.8; 370/310.2; 370/328; 379/433.01; 379/433.12

(58) Field of Classification Search
USPC .......... 455/550.1, 556.2, 575.1, 575.3, 575.4, 455/575.8; 370/310.2, 328; 379/433.01, 379/433.12
See application file for complete search history.

(56) References Cited

U.S. PATENT DOCUMENTS

| | | | | |
|---|---|---|---|---|
| 7,395,102 B2* | 7/2008 | Park et al. | ................... | 455/575.4 |
| 7,529,571 B2* | 5/2009 | Byun et al. | ................... | 455/575.4 |
| 7,774,033 B2* | 8/2010 | Lee | ............................ | 455/575.4 |
| 7,813,776 B2* | 10/2010 | Lee et al. | ................... | 455/575.4 |
| 7,912,524 B2* | 3/2011 | Kim et al. | ................... | 455/575.4 |
| 2003/0193787 A1 | 10/2003 | Manabe et al. | | |
| 2008/0076293 A1 | 3/2008 | Wang et al. | | |
| 2008/0298025 A1 | 12/2008 | Chang et al. | | |
| 2009/0067138 A1 | 3/2009 | Oliver et al. | | |
| 2009/0147485 A1 | 6/2009 | Higashigawa et al. | | |

OTHER PUBLICATIONS

International Search Report and Written Opinion dated Dec. 6, 2010 issued in corresponding PCT application No. PCT/US2010/042984, 12 pages.
International Preliminary Report on Patentability dated Jan. 31, 2013 issued in corresponding PCT application No. PCT/US2010/042984, 8 pages.

* cited by examiner

*Primary Examiner* — Steve D Agosta
(74) *Attorney, Agent, or Firm* — Snyder, Clark, Lesch & Chung, LLP (57) ABSTRACT

A sliding mechanism comprising a double-folded flexible printed circuit board (FPC); a stiffener coupled to the double-folded FPC; first pins; second pins; and an opening defined by a first cover, wherein when the double-folded FPC and the stiffener move, within the opening, in synchronization along a first range of motion to an open position of the slider mechanism, the stiffener makes contact with the first pins at the open position, and when the double-folded FPC and the stiffener move, within the opening, in synchronization along a second range of motion to a closed position of the slider mechanism, the stiffener makes contact with the second pins at the closed position.

25 Claims, 7 Drawing Sheets

DOUBLE-FOLDED FLEXIBLE PRINTED CIRCUIT BOARD FOR SLIDER-TYPE MOBILE DEVICES

BACKGROUND

With the development of user devices, users may access and exchange information anywhere and anytime. Typically, these user devices offer users a variety of services and applications. For example, these user devices may provide telephone service, e-mail service, texting service, as well as access to the Internet, social networks, etc.

In today's marketplace, developers provide users with a variety of styles for these user devices. For example, the user device may take the form of a candy-bar style, a clamshell style, or a slider style. The user device having a slider style comprises a slider mechanism to allow one portion of the user device to slide away from another portion of the user device.

SUMMARY

According to one aspect, a slider mechanism may comprise a double-folded flexible printed circuit board (FPC); a stiffener coupled to the double-folded FPC; first pins; second pins; and an opening defined by a first cover, wherein when the double-folded FPC and the stiffener move, within the opening, in synchronization along a first range of motion to an open position of the slider mechanism, the stiffener makes contact with the first pins at the open position, and when the double-folded FPC and the stiffener move, within the opening, in synchronization along a second range of motion to a closed position of the slider mechanism, the stiffener makes contact with the second pins at the closed position.

Additionally, the first folding of the double-folded FPC may include a first portion of the double-folded FPC above the first cover and a second portion of the double-folded FPC below the first cover.

Additionally, the second portion of the double folded FPC may be coupled to the stiffener.

Additionally, a second folding of the double-folded FPC may include a first portion of the double-folded FPC above a second cover and a second portion of the double-folded FPC below the second cover.

Additionally, the stiffener may include bumps to couple the stiffener to the double-folded FPC.

Additionally, the bumps may reside on a first side of the stiffener and an opposite side, relative to the first side.

Additionally, the double-folded FPC may have an "S" configuration.

Additionally, the first pins and the second pins may extend from the first cover.

Additionally, a portion of the stiffener may extend beyond the double-sided FPC in a direction that is perpendicular to the first range of motion and the second range of motion.

Additionally, the slider mechanism may reside in a user device that includes a radio telephone.

Additionally, a slider user device may comprise a double-folded flexible printed circuit board (FPC); a stiffener coupled to the double-folded FPC; first pins; second pins; and an opening defined by a first cover, wherein when the double-folded FPC and the stiffener move, within the opening, in synchronization along a first range of motion to an open position of the slider mechanism, the stiffener makes contact with the first pins at the open position, and when the double-folded FPC and the stiffener move, within the opening, in synchronization along a second range of motion to a closed position of the slider mechanism, the stiffener makes contact with the second pins at the closed position.

Additionally, a first folding of the double-folded FPC may include a first portion of the double-folded FPC above the first cover and a second portion of the double-folded FPC below the first cover.

Additionally, the second portion of the double folded FPC may be coupled to the stiffener.

Additionally, a second folding of the double-folded FPC may include a first portion of the double-folded FPC above a second cover and a second portion of the double-folded FPC below the second cover.

Additionally, the stiffener may include bumps to couple the stiffener to the double-folded FPC and act as a spacer.

Additionally, the bumps may reside on a first side of the stiffener and an opposite side, relative to the first side.

Additionally, the double-folded FPC may have an "S" configuration.

Additionally, the first pins and the second pins may extend from the first cover.

Additionally, a portion of the stiffener may extend beyond the double-sided FPC in a direction that is perpendicular to the first range of motion and the second range of motion.

Additionally, the slider user device may comprise a wireless telephone.

BRIEF DESCRIPTION OF THE DRAWINGS

The accompanying drawings, which are incorporated in and constitute a part of this specification, illustrate exemplary embodiments described herein and, together with the description, explain these exemplary embodiments. In the drawings.

DETAILED DESCRIPTION

The following detailed description refers to the accompanying drawings. The same reference numbers in different drawings may identify the same or similar elements. Also, the following description does not limit the invention. Rather, the scope of the invention is defined by the appended claims.

According to exemplary embodiments, a slider user device may include a slider mechanism comprising a double-folded FPC. According to an exemplary embodiment, the double-folded FPC may be coupled to a stiffener to secure the folding positions of the double-folded FPC. The slider mechanism may comprise pins that are positioned to limit the sliding motion of the double-folded FPC. That is, the pins may limit the sliding to an open position and to a closed position. According to an exemplary embodiment, the stiffener, which is coupled to the double-folded FPC, may come in contact with the pins at the open position and the closed position to avoid damage to the double-folded FPC. The double-folded FPC may slide within an opening defined by cover(s) associated with the slider user device. According to an exemplary embodiment, the double-folded FPC may be double-folded beneath one of the covers.

Figure 1:
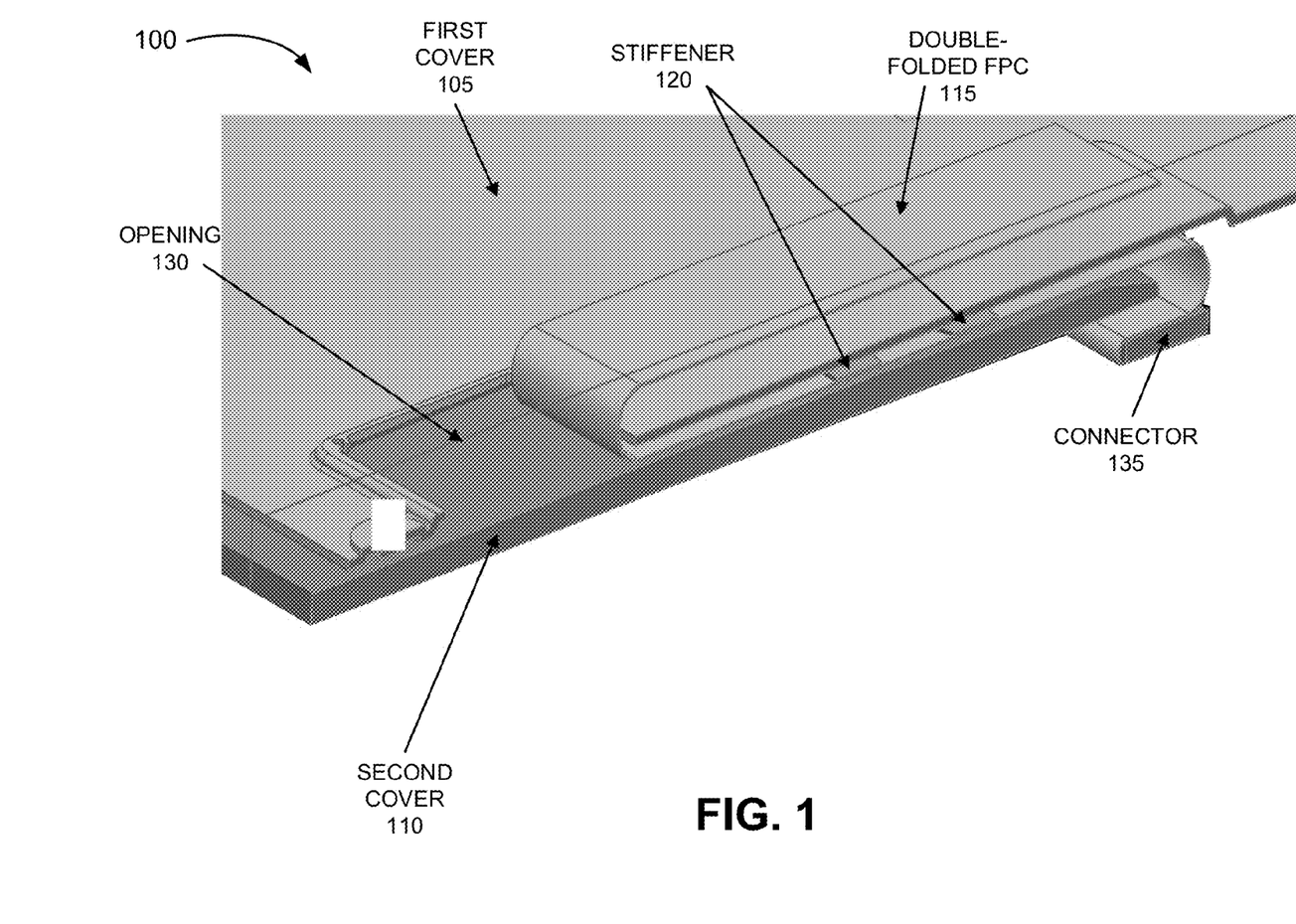
FIG. 1 is a diagram illustrating a cross-sectional view of an exemplary embodiment of a sliding mechanism that includes a double-folded flexible printed circuit board (FPC) implemented in a slider user device.

FIG. 1 is a diagram illustrating a cross-sectional view of an exemplary embodiment of a sliding mechanism that comprises a double-folded FPC implemented in a slider user device. As illustrated, a slider user device 100 may include a first cover 105, a second cover 110, a double-folded FPC 115, a stiffener 120, and an opening 130. Although not illustrated, the sliding mechanism may include pins, which will be described and illustrated further below.

First cover 105 and second cover 110 may each correspond to a cover associated with slider user device 100. By way of example, slider user device 100 may comprise a first portion and a second portion, in which the first portion may comprise a display and the second portion may comprise a keypad. According to such an exemplary slider design, first cover 105 may correspond to a back or bottom of the first portion and second cover 110 may correspond to a front or top of the second portion. First cover 105 and/or second cover 110 may be made of plastic, metal, or some other suitable material. As illustrated in FIG. 1, first cover 105 may define opening 130.

Double-folded FPC 115 may comprise an FPC. The FPC may include circuits associated with various components of slider user device 105, such as, for example, a display, speakers, a camera, a keypad, and/or the like. According to an exemplary embodiment, double-folded FPC 115 may have a configuration synonymous with the configuration illustrated in FIG. 1. For example, double-folded FPC 115 may comprise two foldings and may have an S-configuration.

Stiffener 120 may be made of a rigid material (e.g., plastic, etc.) that has a planar configuration. Stiffener 120 may comprise bumps on both sides (e.g., a top side and a bottom side) to reduce friction with first cover 105 and second cover 110. The bumps may also act as a spacer to avoid double-folded FPC 115 touching first cover 105 and second cover 110. Stiffener 120 may include holes to reduce the weight of stiffener 120. According an exemplary embodiment, stiffener 120 may be coupled to double-folded FPC 115 and assist double-folded FPC 115 in maintaining its double-folded configuration. Opening 130 may be an opening to provide space for double-folded FPC 115 and stiffener 120 to move during a sliding operation. In this example, opening 130 may be formed by first cover 105. Connector 135 may connect double-folded FPC 115 to other components (e.g., a printed circuit board, etc.).

As illustrated in FIG. 1, double-folded FPC 115 and stiffener 120 may be in a position corresponding to when slider user device 100 is in a closed position. According to an exemplary operation, when slider user device 100 is slid to an open position, double-folded FPC 115 and stiffener 120 may move toward pins. Pins may provide a stopping point corresponding to the open position. According to an exemplary embodiment, stiffener 120 may come into contact with pins to stop the sliding motion to the open position. The opening defined by first cover 105 may permit stiffener to travel approximately ¼ of the sliding stroke. According to other embodiments, the opening may be of a different dimension.

As a result of the foregoing, slider user device 100 may permit a user to experience a large stroke and provide that the overlap between the first portion and the second portion is relatively small. Additionally, according to some conventional slider designs, a large opening associated with the first cover may be used to accommodate the FPC and permit the FPC to slide within the opening. However, when the slider user device is in an open position, a portion of the opening may be visible to the user. One solution to this problem is to include a sliding door mechanism to cover the opening. However, such a configuration is complicated, requires fine motion coordination, and/or may be unreliable. According to the exemplary embodiments described herein, however, the opening associated with the first cover may be reduced based on double-folded FPC 115 and may not be visible to the user, and in turn, the sliding door mechanism may not be needed to cover the opening. According to such exemplary embodiments, the length of the stroke may remain large.

Figure 2:
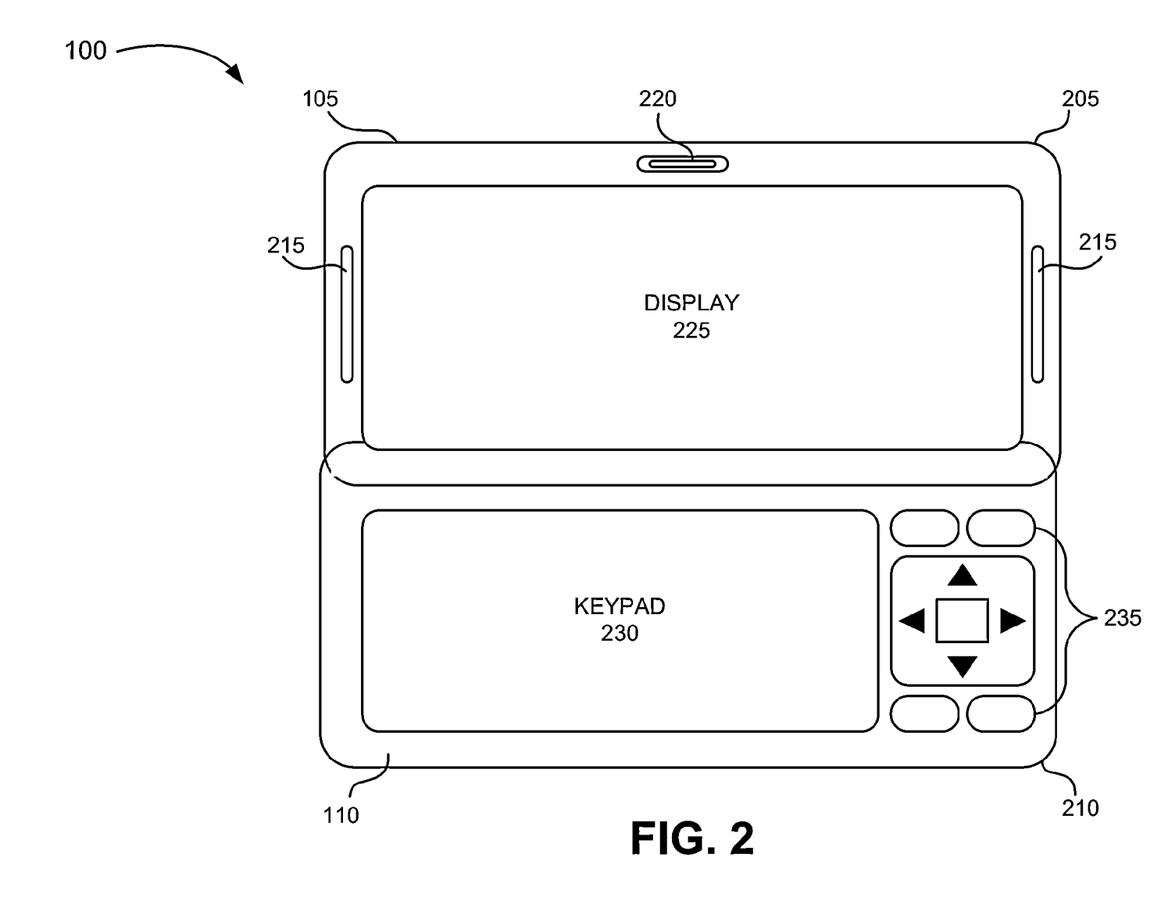
FIG. 2 is a diagram illustrating an exemplary slider user device in which exemplary embodiments described herein may be implemented.

FIG. 2 is a diagram illustrating an exemplary slider user device 100 in which exemplary embodiments described herein may be implemented. The term "slider user device," as used herein, is intended to be broadly interpreted to comprise a variety of devices. By way of example, slider user device 100 may comprise a portable device, a mobile device, or a handheld device. Slider user device 100 may comprise a telephone (e.g., a smart phone, a radio phone, a cellular phone, a wireless phone, etc.), a personal digital assistant (PDA), a data organizer, a calculator, a picture capturing device, a video capturing device, a computer, a Web-access device, a music playing device, a location-aware device, a gaming device, and/or some other type of user device.

As illustrated in FIG. 2, slider user device 100 may comprise a first portion 205, a second portion 210, speakers 215, a microphone 220, a display 225, a keypad 230, and special purpose keys 235. According to other embodiments, slider user device 100 may comprise fewer components, additional components, different components, and/or a different arrangement of components than those illustrated in FIG. 2 and described herein. Additionally, or alternatively, although slider user device 100 is depicted as having a landscape configuration, according to other embodiments, slider user device 100 may have a portrait configuration or some other type of configuration.

First portion 205 may comprise a first structure to include one or more components of slider user device 100. First portion 205 may be formed from plastic, metal, or some other suitable material. According to an exemplary implementation, first portion 205 may include, among other components, display 225. Additionally, according to an exemplary implementation, a back-side of first portion 205 may correspond to first cover 105.

Second portion 210 may comprise a second structure to include one or more components of slider user device 100. Second portion 210 may be formed from plastic, metal, or some other suitable material. According to an exemplary implementation, second portion 210 may include, among other components, keypad 230. Additionally, according to an exemplary implementation, a top-side of second portion 210 may correspond to second cover 110.

Speakers 215 may transduce an electrical signal to a corresponding sound wave. For example, a user may listen to music, to a calling party, etc., through speakers 215. Microphone 220 may transduce a sound wave to a corresponding electrical signal. For example, a user may speak into microphone 220 during a telephone call, to execute a voice command, to execute a voice-to-text conversion, etc.

Display 225 may operate as an output component. For example, display 225 may comprise a liquid crystal display (LCD), a plasma display panel (PDP), a field emission display (FED) a thin film transistor (TFT) display, or some other type of display technology. Additionally, according to an exemplary implementation, display 225 may operate as an input component. For example, display 225 may comprise a touch-sensitive screen. In such instances, display 225 may correspond to a single-point input device (e.g., capable of sensing a single touch) or a multipoint input device (e.g., capable of sensing multiple touches that occur at the same time). Display 225 may be implemented using one of a variety of sensing technologies, such as, for example, capacitive sensing, surface acoustic wave sensing, resistive sensing, optical sensing, pressure sensing, infrared sensing, or gesture sensing. Display 225 may also provide for an auto-rotating function, as well as other gesture-based functions (e.g., zoom, etc.). Display 225 may be capable of displaying text, pictures, and video. Display 225 may also be capable of displaying various images (e.g., icons, objects, etc.) that may be selected by a user to access various applications, enter data, navigate through user interfaces, etc.

Keypad 230 may provide input to slider user device 100. For example, keypad 230 may comprise a standard telephone keypad, a QWERTY keypad, and/or some other type of keypad (e.g., a calculator keypad, a numerical keypad, etc.). Special purpose keys 235 may provide input to slider user device 100. For example, special purpose keys 235 may provide particular functions (e.g., send a message, place a call, open an application, etc.) and/or allow the user to select and/or navigate through user interfaces.

Figure 3:
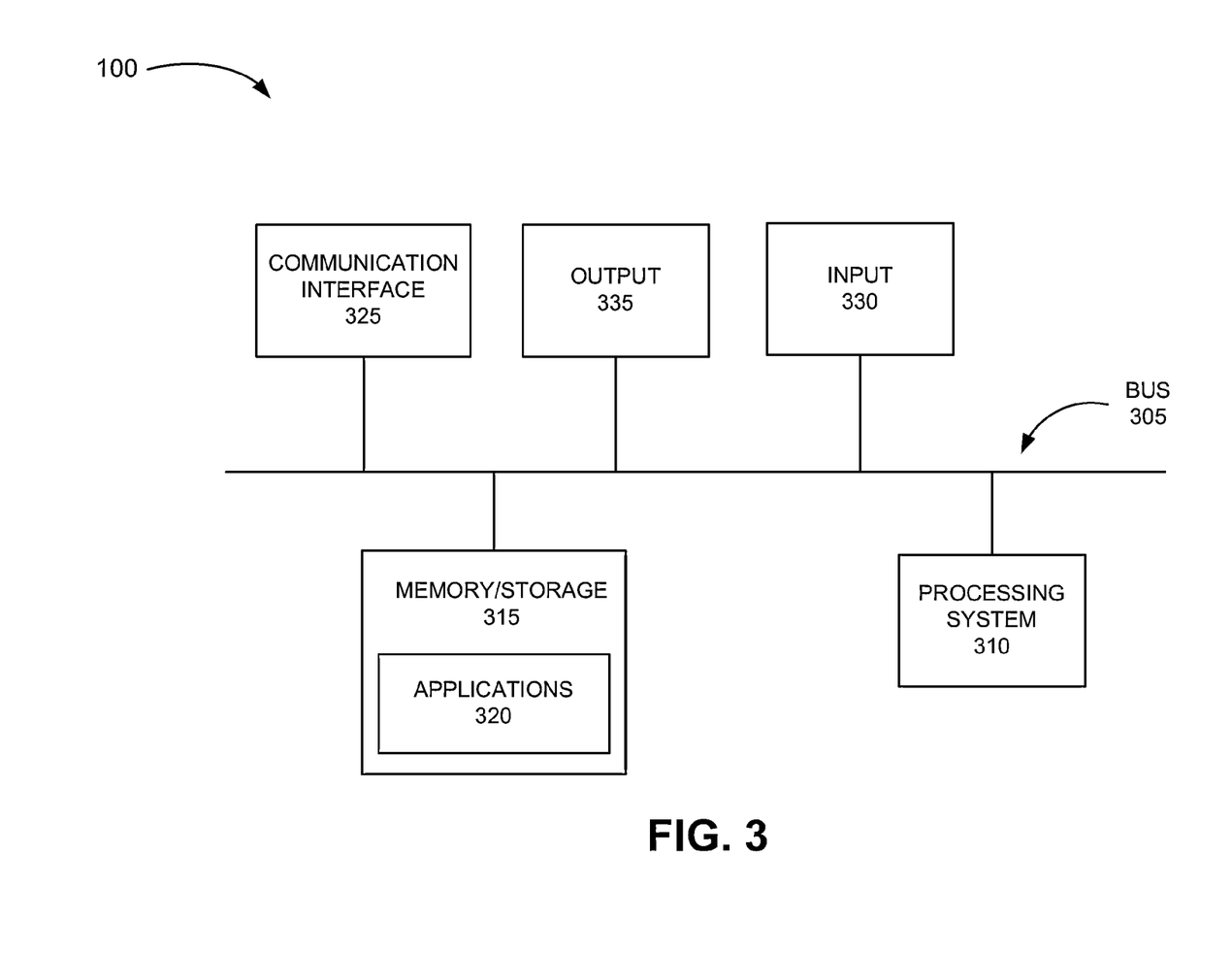
FIG. 3 is a diagram illustrating exemplary components of the slider user device.

FIG. 3 is a diagram illustrating exemplary components of slider user device 100. As illustrated, slider user device 100 may comprise a bus 305, a processing system 310, a memory/storage 315 that may comprise applications 320, a communication interface 325, an input 330, and an output 335. According to other embodiments, slider user device 100 may comprise fewer components, additional components, different components, and/or a different arrangement of components than those illustrated in FIG. 3 and described herein.

Bus 305 may include a path that permits communication among the components of slider user device 100. Bus 305 may include a system bus, an address bus, a data bus, and/or a control bus. Bus 305 may also include bus drivers, bus arbiters, bus interfaces, and/or clocks.

Processing system 310 may include one or multiple processors, microprocessors, data processors, co-processors, application specific integrated circuits (ASICs), system-on-chips (SOCs), application specific instruction-set processors (ASIPs), controllers, programmable logic devices (PLDs), chipsets, field programmable gate arrays (FPGAs), and/or some other processing logic that may interpret and/or execute instructions and/or data. Processing system 310 may control the overall operation, or a portion of operation(s) performed by slider user device 100. Processing system 310 may perform operations based on an operating system and/or various applications (e.g., applications 320). Processing system 310 may access instructions from memory/storage 315, from other components of slider user device 100, and/or from a source external to slider user device 100 (e.g., another device or a network).

Memory/storage 315 may comprise one or multiple memories and/or one or multiple secondary storages. For example, memory/storage 315 may comprise a random access memory (RAM), a dynamic random access memory (DRAM), a static random access memory (SRAM), a read only memory (ROM), a programmable read only memory (PROM), a ferroelectric random access memory (FRAM), an erasable programmable read only memory (EPROM), a flash memory, and/or some other form of storing hardware. Memory/storage 315 may comprise a hard disk (e.g., a magnetic disk, an optical disk, a magneto-optic disk, a solid state disk, etc.) and/or some other type of storing medium (e.g., a computer-readable medium, a compact disk (CD), a digital versatile disk (DVD), or the like) along with a corresponding drive. The term "computer-readable medium," as used herein, is intended to be broadly interpreted to comprise, for example, a memory, a secondary storage, a compact disc (CD), a digital versatile disc (DVD), or the like. Memory/storage 315 may comprise a memory, a storage device, or a storage component that is external to and/or removable from slider user device 100, such as, for example, a Universal Serial Bus (USB) memory, a dongle, a hard disk, mass storage, off-line storage, or the like.

Memory/storage 315 may store data, applications 320, and/or instructions related to the operation of slider user device 100. Applications 320 may comprise software that provides various services or functions. By way of example, applications 320 may comprise a telephone application, a voice recognition application, a video application, a multimedia application, a music playing application, a texting application, an instant messaging application, etc.

Communication interface 325 may permit slider user device 100 to communicate with other devices, networks, and/or systems. For example, communication interface 325 may comprise one or multiple wireless and/or wired communication interfaces. Communication interface 325 may comprise a transmitter, a receiver, or a transceiver. Communication interface 325 may operate according to one or multiple protocols, communication standards, or the like.

Input 330 may permit an input into slider user device 100. For example, input 330 may comprise a keyboard, a keypad (e.g., keypad 230), a touch screen (e.g., display 225), a touch pad, a mouse, a port, a button, a switch, a microphone (e.g., microphone 220), voice recognition logic, an input port, a knob, and/or some other type of input component. Output 335 may permit slider user device 100 to provide an output. For example, output 335 may include a display (e.g., display 225), a speaker (e.g., speakers 215), light emitting diodes (LEDs), an output port, a vibratory mechanism, or some other type of output component.

Slider user device 100 may perform operations in response to processing system 310 executing software instructions contained in a computer-readable medium, such as, memory/storage 315. For example, the software instructions may be read into memory/storage 315 from another computer-readable medium or from another device via communication interface 325. The software instructions stored in memory/storage 315 may cause processing system 310 to perform various processes described herein. Alternatively, slider user device 100 may perform processes based on hardware, hardware and firmware, and/or hardware, software, and firmware.

Figure 4A:
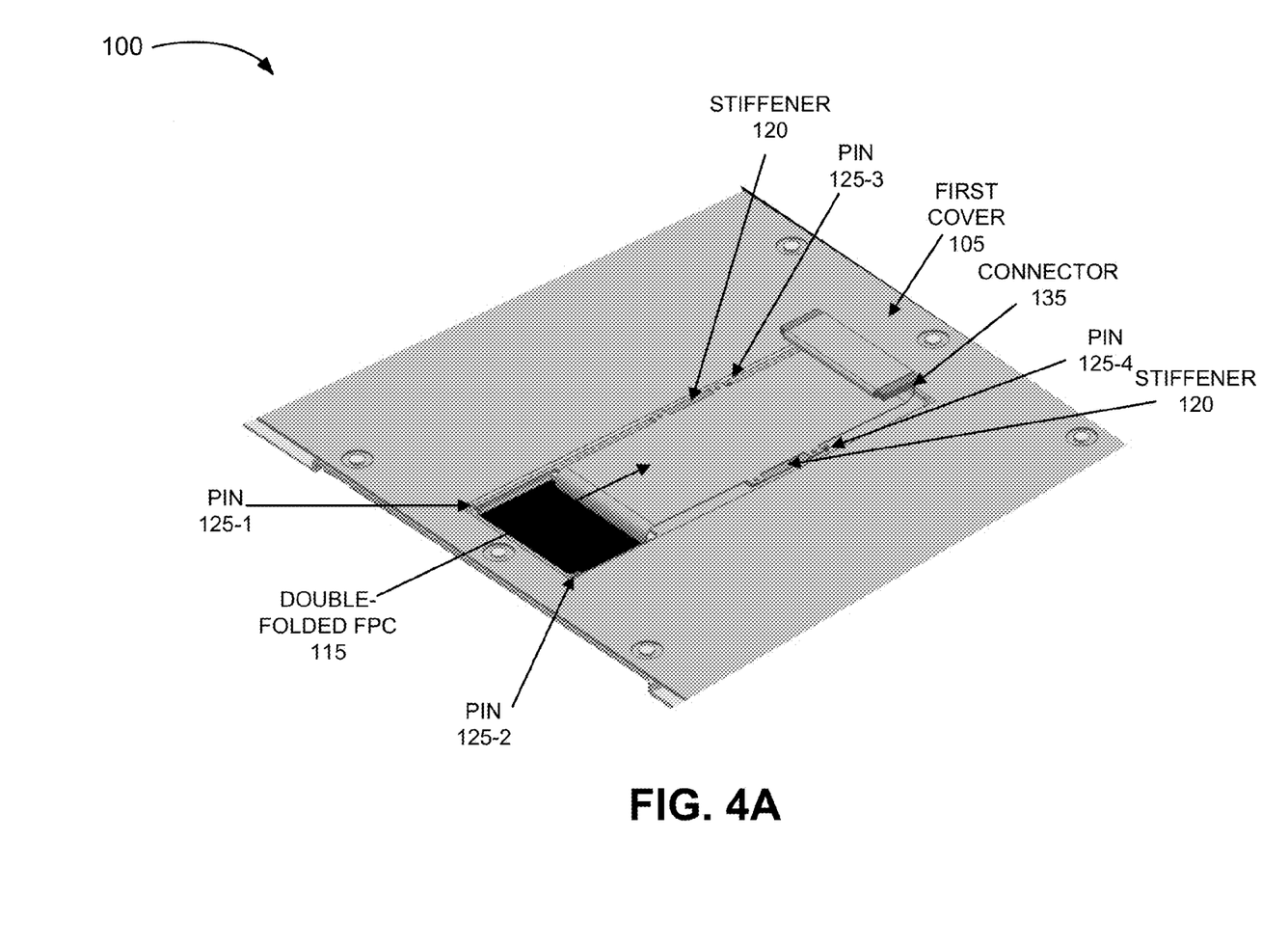
FIG. 4A is a diagram illustrating a bottom view of the double-folded FPC when the slider user device is in a closed position.
Figure 4B:
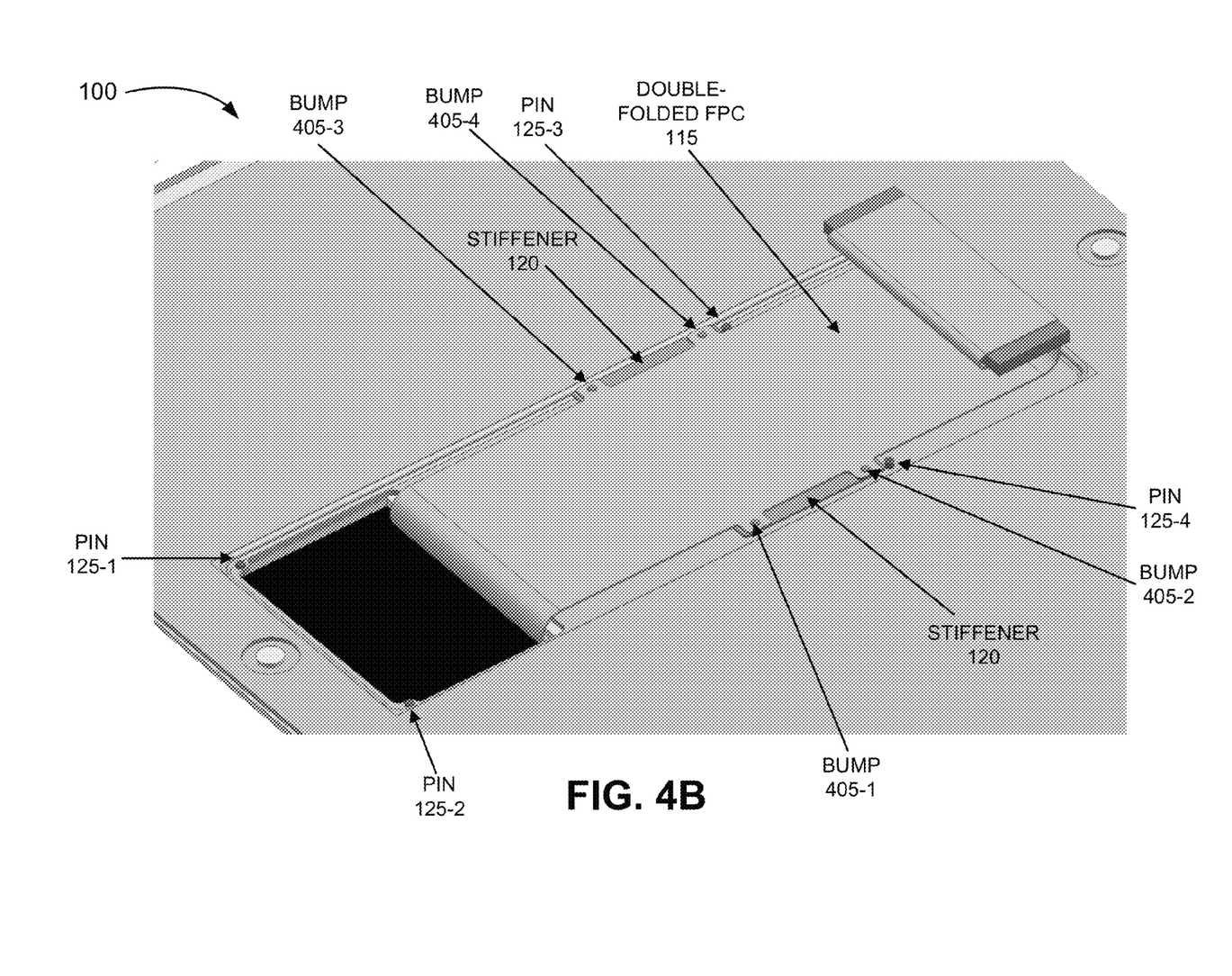
FIG. 4B is a diagram illustrating an enlarged top view of the double-folded FPC when the slider user device is in a closed position.

FIG. 4A is a diagram illustrating a bottom view of double-folded FPC 115 when slider user device 100 is in a closed position. That is, the view corresponds to a bottom surface of first cover 105 with second cover 110 removed. Referring to FIG. 4A, as previously described, according to an exemplary embodiment, a slider mechanism may include, among other things, first cover 105, double-folded FPC 115, stiffener 120, and pins 125-1 through 125-4 (referred to generally as pin 125 or pins 125). As further illustrated in FIG. 4B, according to an exemplary embodiment, bumps 405-1 through 405-4 (referred to generally as bump 405 or bumps 405) may couple stiffener 120 to double-folded FPC 115. Additionally, as illustrated in FIG. 4B, pins 125 may be positioned in a symmetrical fashion. Pins 125-3 and 125-4 may make contact with stiffener 120 when slider user device 100 is in a closed position, and pins 125-1 and 125-2 may make contact with stiffener 120 when slider user device 100 is in an open position. In this way, stiffener 120 and double-folded FPC 115 may travel between pins 125. According to an exemplary implementation, pins 125 may extend from first cover 105.

Figure 4C:
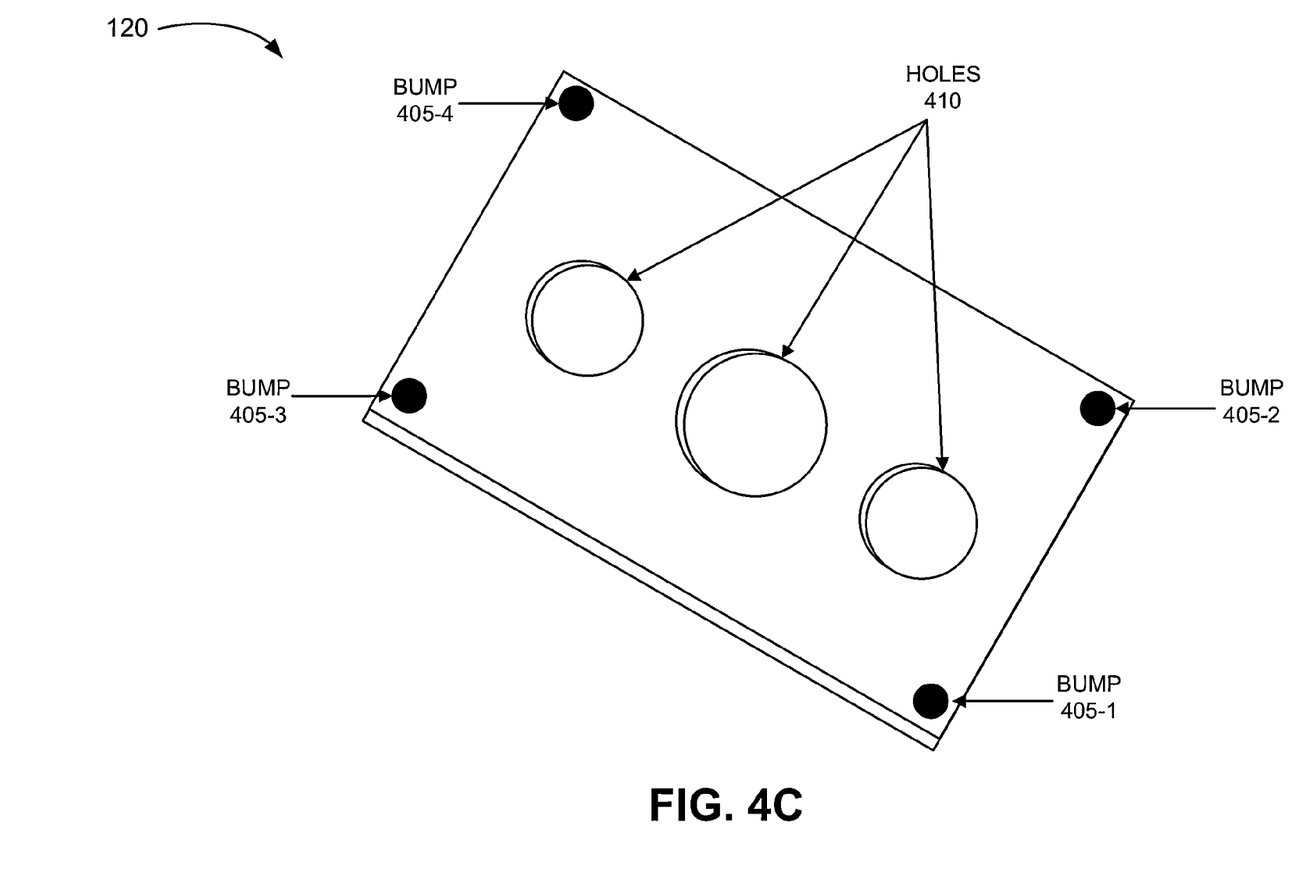
FIG. 4C is a diagram illustrating an exemplary stiffener.

FIG. 4C is a diagram illustrating an exemplary stiffener 120. According to an exemplary embodiment, stiffener 120 may have a rectangular configuration. According to other exemplary embodiments, stiffener 120 may have some other suitable shape. As illustrated, bumps 405 may be dispersed in a symmetrical fashion. According to an exemplary embodiment, bumps 405 may reside on both sides (i.e., a front face and a back-side face) of stiffener 120 to help reduce friction with respect to first cover 105 and second cover 110.

According to an exemplary embodiment, stiffener 120 may include holes 410 to reduce the weight of stiffener 120. Holes 410 may be of any number, size, and/or shape. In this example, holes 410 have a circular shape. According to other exemplary embodiments, stiffener 120 may not include holes 410.

Figure 4D:
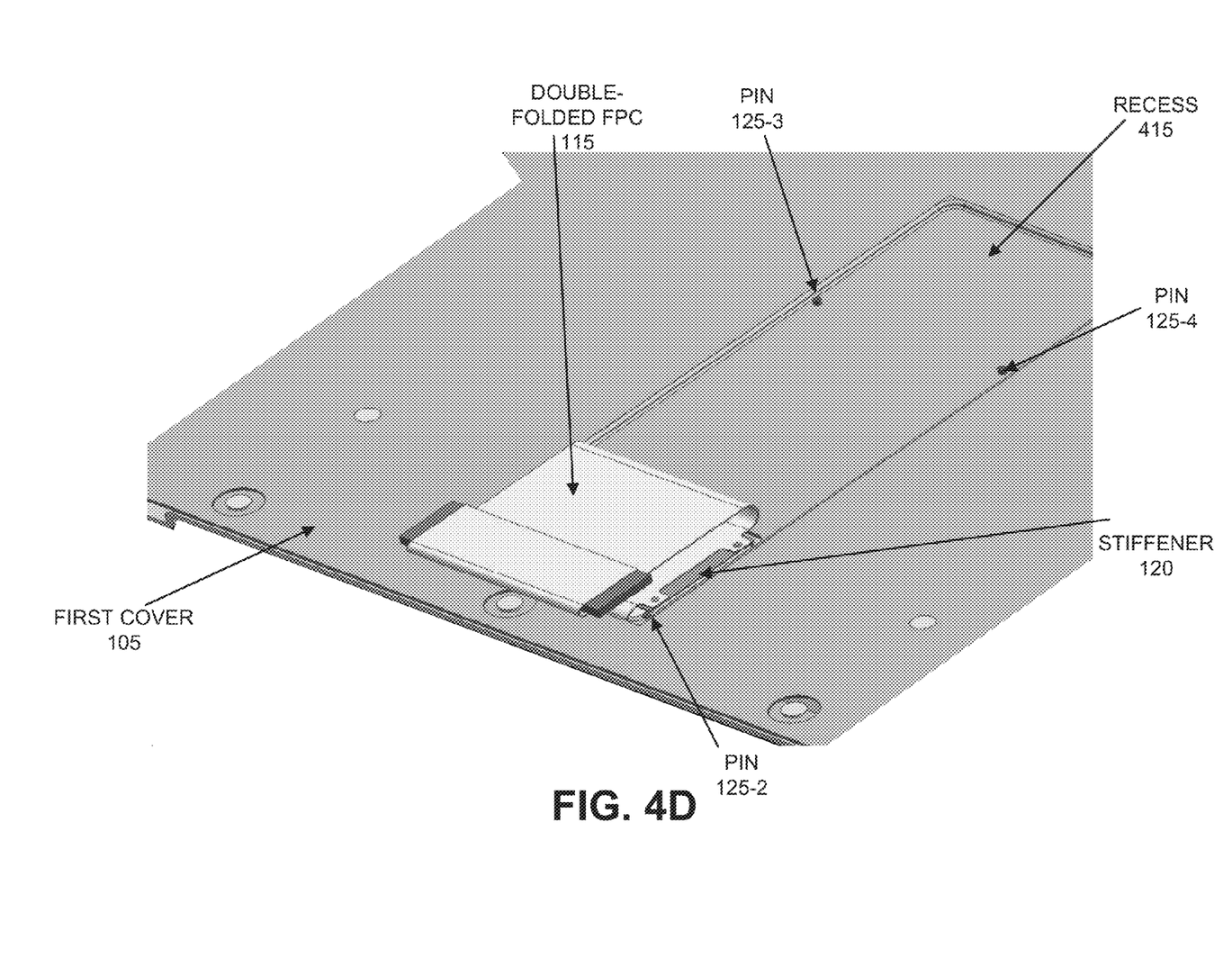
FIG. 4D is a diagram illustrating a bottom view of the double-folded FPC when the slider user device is in an open position.

FIG. 4D is a diagram illustrating a bottom view of double-folded FPC 115 when slider user device 100 is in an open position. That is, the view corresponds to a bottom surface of first cover 105 with second cover 110 removed. As illustrated, stiffener 120 may make contact with pin 125-2 and pin 125-1. Additionally, by stiffener 120 making contact with pins 125, double-folded FPC 115 may avoid making contact with an edge of first cover 105. According to an exemplary embodiment, stiffener 120 may travel between pins 125 for a distance of approximately 21 mm. According to other embodiments, the distance may be greater than 21 mm or less than 21 mm. Additionally, as illustrated in FIG. 4D, there may be a recess 415 that provides a space between first cover 105 and second cover 110. Recess 415 may have a dimension to accommodate stiffener 120 and double-folded FPC 115. For example, recess 415 may have a depth of approximately 0.5 mm.

The foregoing description of embodiments provides illustration, but is not intended to be exhaustive or to limit implementations to the precise form disclosed. Modifications and variations of the embodiments and/or implementations are possible in light of the above teachings, or may be acquired from practice of the teachings.

The terms "comprise," "comprises" or "comprising," as well as synonyms thereof (e.g., include, etc.), when used in the specification is meant to specify the presence of stated features, integers, steps, or components but does not preclude the presence or addition of one or more other features, integers, steps, components, or groups thereof. In other words, these terms are to be interpreted as inclusion without limitation.

The terms "couple," "couples," "coupled," etc., as well as synonyms thereof (e.g., connects, linked, attached, etc.), when used in the specification is meant to include a direct connection or an indirect connection between two or more elements.

Spatially relative terms, such as, for example, "top," "bottom," "beneath," "upward," "up," "downward," and the like, may be used for ease of description to describe one element's relationship to another element or to describe one feature's relationship to another feature, as may be illustrated in the figures and/or described. Spatially relative terms are intended to encompass different orientations of the slider user device in use or operation, in addition to the use or the operation illustrated in the figures and/or described. For example, if the slider user device in a figure is turned over or oriented differently than an orientation illustrated (e.g., rotated at 90 degrees or some other rotation, etc.), the spatially relative terms used herein should be interpreted accordingly.

The terms "a," "an," and "the" are intended to be interpreted to include both the singular and plural forms, unless the context clearly indicates otherwise. Further, the phrase "based on" is intended to be interpreted to mean, for example, "based, at least in part, on," unless explicitly stated otherwise. The term "and/or" is intended to be interpreted to include any and all combinations of one or more of the associated list items.

No element, act, or instruction disclosed in the specification should be construed as critical or essential to the embodiments described herein unless explicitly described as such.

What is claimed is:

1. A slider mechanism of a slider-type mobile device comprising:
   a double-folded flexible printed circuit board (FPC);
   a stiffener coupled to the double-folded FPC;
   first pins;
   second pins; and
   an opening defined by a first cover of the slider-type mobile device, wherein when the double-folded FPC and the stiffener move, within the opening, in synchronization along a first range of motion to an open position of the slider mechanism, the stiffener makes contact with the first pins at the open position, and when the double-folded FPC and the stiffener move, within the opening, in synchronization along a second range of motion to a closed position of the slider mechanism, the stiffener makes contact with the second pins at the closed position, wherein a first folding of the double-folded FPC includes a first portion of the double-folded FPC above the first cover and a second portion of the double-folded FPC below the first cover, and wherein the second portion of the double folded FPC is coupled to the stiffener.

2. The slider mechanism of claim 1, wherein the first cover comprises a display.

3. The slider mechanism of claim 1, wherein the stiffener includes one or more holes, wherein the one or more holes reduce a weight of the stiffener.

4. The slider mechanism of claim 1, wherein a second folding of the double-folded FPC includes a first portion of the double-folded FPC above a second cover of the slider-type mobile device and a second portion of the double-folded FPC below the second cover.

5. The slider mechanism of claim 1, wherein the stiffener includes bumps to couple the stiffener to the double-folded FPC.

6. The slider mechanism of claim 5, wherein the bumps reside on a first side of the stiffener and an opposite side, relative to the first side.

7. The slider mechanism of claim 1, wherein the double-folded FPC has an "S" configuration.

8. The slider mechanism of claim 1, wherein the first pins and the second pins extend from the first cover.

9. The slider mechanism of claim 1, wherein a portion of the stiffener extends beyond the double-sided FPC in a direction that is perpendicular to the first range of motion and the second range of motion.

10. The slider mechanism of claim 1, wherein the slider-type mobile device includes a radio telephone.

11. A slider-type mobile device comprising:
    a double-folded flexible printed circuit board (FPC);
    a stiffener coupled to the double-folded FPC;
    first pins;
    second pins; and
    an opening defined by a first cover, wherein when the double-folded FPC and the stiffener move, within the opening, in synchronization along a first range of motion to an open position of the slider mechanism, the stiffener makes contact with the first pins at the open position, and when the double-folded FPC and the stiffener move, within the opening, in synchronization along a second range of motion to a closed position of the slider mechanism, the stiffener makes contact with the second pins at the closed position, wherein the stiffener includes bumps that couple the stiffener to the double-folded FPC and act as a spacer, and wherein the bumps reside on a first side of the stiffener and an opposite side, relative to the first side.

12. The slider-type mobile device of claim 11, wherein a first folding of the double-folded FPC includes a first portion of the double-folded FPC above the first cover and a second portion of the double-folded FPC below the first cover.

13. The slider-type mobile device of claim 12, wherein the second portion of the double folded FPC is coupled to the stiffener.

14. The slider-type mobile device of claim 11, wherein a second folding of the double-folded FPC includes a first portion of the double-folded FPC above a second cover and a second portion of the double-folded FPC below the second cover.

15. The slider-type mobile device of claim 11, wherein a distance between the first pins and the second pins is approximately 21 mm.

16. The slider-type mobile device of claim 11, wherein the stiffener includes one or more holes, wherein the one or more holes reduce a weight of the stiffener.

17. The slider-type mobile device of claim 11, wherein the double-folded FPC has an "S" configuration.

18. The slider-type mobile device of claim 11, wherein the first pins and the second pins extend from the first cover.

19. The slider-type mobile device of claim 11, wherein a portion of the stiffener extends beyond the double-sided FPC in a direction that is perpendicular to the first range of motion and the second range of motion.

20. The slider-type mobile device of claim 11, wherein the slider-type mobile device comprises a wireless telephone.

21. A slider-type mobile device comprising:
a double-folded flexible printed circuit board (FPC);
a stiffener coupled to the double-folded FPC;
first pins;
second pins; and
an opening defined by a first cover, wherein when the double-folded FPC and the stiffener move within the opening and along a first range of motion to an open position of the slider mechanism, the stiffener makes contact with the first pins at the open position, and when the double-folded FPC and the stiffener move within the opening along a second range of motion to a closed position of the slider mechanism, the stiffener makes contact with the second pins at the closed position, wherein the stiffener includes bumps that couple the stiffener to the double-folded FPC and act as a spacer, and wherein the bumps reside on a first side of the stiffener and a second side of the stiffener, which is an opposite side relative to the first side.

22. The slider-type mobile device of claim 21, wherein the first pins and the second pins extend from the first cover.

23. The slider-type mobile device of claim 21, wherein a portion of the stiffener extends beyond edges of the double-sided FPC.

24. The slider-type mobile device of claim 21, wherein the double-folded FPC includes holes that receive the bumps.

25. The slider-type mobile device of claim 21, wherein a second folding of the double-folded FPC includes a first portion of the double-folded FPC above a second cover and a second portion of the double-folded FPC below the second cover.

* * * * *